(12) United States Patent
Yang

(10) Patent No.: US 8,049,854 B2
(45) Date of Patent: Nov. 1, 2011

(54) LIQUID CRYSTAL DISPLAY DEVICE AND METHOD FOR FABRICATING THE SAME

(75) Inventor: Hee Jung Yang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/906,815

(22) Filed: Oct. 18, 2010

(65) Prior Publication Data

US 2011/0033959 A1 Feb. 10, 2011

Related U.S. Application Data

(62) Division of application No. 11/808,997, filed on Jun. 14, 2007, now Pat. No. 7,839,475.

(30) Foreign Application Priority Data

Jun. 29, 2006 (KR) .............................. 2006-059223

(51) Int. Cl.
*G02F 1/1343* (2006.01)
*G02F 1/136* (2006.01)
*G02F 1/13* (2006.01)

(52) U.S. Cl. ............................ 349/139; 349/43; 349/187

(58) Field of Classification Search .................... 349/42, 349/43, 139–152, 187
See application file for complete search history.

(56) References Cited

U.S. PATENT DOCUMENTS

| 7,220,611 | B2 * | 5/2007 | Chang et al. | 438/30 |
| 7,220,612 | B2 * | 5/2007 | Ahn et al. | 438/30 |
| 7,504,661 | B2 * | 3/2009 | Jung | 257/59 |
| 7,626,206 | B2 | 12/2009 | Ahn et al. | |
| 7,830,464 | B2 * | 11/2010 | Song et al. | 349/43 |

* cited by examiner

*Primary Examiner* — Kevin S Wood
(74) *Attorney, Agent, or Firm* — Morgan, Lewis & Bockius LLP

(57) ABSTRACT

A liquid crystal display (LCD) device having an array substrate with a top gate type TFT includes a first transparent metal layer deposited to enhance the adhesion between a data metal layer and an insulating substrate before a data metal deposition, and a second transparent metal layer deposited to enhance the adhesion between a gate metal layer and an insulating substrate before a gate metal deposition. The LCD device having the array substrate with a top gate type TFT can be fabricated with a reduced number of masking or sputtering processes, thereby reducing the fabrication time of the LCD device and increasing the yield of the LCD device.

5 Claims, 6 Drawing Sheets

LIQUID CRYSTAL DISPLAY DEVICE AND METHOD FOR FABRICATING THE SAME

This application is a Divisional of U.S. patent application Ser. No. 11/808,997, filed Jun. 14, 2007, now U.S. Pat. No. 7,839,475, and claims the benefit of Korean Patent Application No. 059223/2006 filed in Korea on Jun. 29, 2006, both of which is are hereby incorporated by reference in their entirety.

BACKGROUND OF THE INVENTION

1. Field of the Invention

The present invention relates to a liquid crystal display (LCD) device and a method for fabricating the same, and more particularly, to an LCD device that can simplify a fabricating process, and a method for fabricating the same.

2. Discussion of the Related Art

With rapid development of information technology, flat panel display devices are in great demand because of their superior characteristics such as slimness, light weight, and low power consumption. Among those flat panel display devices, liquid crystal display (LCD) devices having excellent color reproduction are being aggressively researched and developed.

An LCD device mainly includes a top substrate, a bottom substrate, and a liquid crystal layer interposed therebetween. The top substrate and the bottom substrate are arranged to face each other. There are a plurality of electrodes formed on facing surfaces of the two substrates. The liquid crystal layer is usually formed by injecting liquid crystals between the two substrates. When a predetermined voltage is applied between the two substrates, an electric field is generated to align liquid crystal molecules in one direction, thereby varying light transmittance. In this way, the LCD device displays an image according to the varying light transmittance.

As one example of various types of LCD devices, an active matrix LCD (AM-LCD) device is widely used because of its excellent resolution and moving picture reproduction. In the AM-LCD device, thin film transistors (TFTs) and pixel electrodes connected thereto are arranged in a matrix form. Also, the pixel electrodes are formed on a bottom substrate (an array substrate), and common electrodes are formed on a top substrate (a color filter substrate). Liquid crystal molecules are driven by an electric field perpendicular to the substrates. The AM-LCD device has high transmittance and aperture ratio. Moreover, since the common electrodes of the top substrate may serve as ground, it is possible to prevent liquid crystal cells from being damaged by static electricity. The top substrate of the LCD device further includes a black matrix for preventing light leakage at a portion other than the pixel electrodes. The bottom substrate of the LCD device is formed by repetitively performing a thin film deposition and a photolithography using a mask. Typically, the LCD device is fabricated using four or five masks. The number of masks used represents the number of processes of fabricating the array substrate.

The array substrate also includes a gate line and a data line that may be formed of a conductive metal such as chromium (Cr), molybdenum (Mo), and tantalum (Ta). Since the conductive metal has superior thermal stability, the formation of hillocks can be prevented. The conductive metal is deposited on the substrate using a physical vapor deposition (PVD) process (e.g., sputtering) and is wet-etched or dry-etched to form the data line and the gate line. Although the conductive metal has the superior thermal stability, high resistivity of the conductive metal may cause a signal delay when the screen size of an image display device becomes larger. Therefore, materials that have low resistivity and do not cause the hillock are essential to the fabrication of the image display device.

New materials for the lines are required to fabricate image display devices of 15 inches or more, super extended graphics array (SXGA) display devices, and ultra extended graphics array (UXGA) display devices. Copper (Cu) and aluminum (Al) are recommended as the adequate line materials because their resistivity is the lowest. However, the aluminum may cause hillocks, and thus aluminum alloy with high resistivity is proposed as an alternative material. Moreover, studies are being conducted on the use of copper (Cu) as a low-resistivity line material.

Hereinafter, an array substrate of an LCD device and a method for fabricating the same according to the related art will be described with reference to FIGS. 1 and 2. FIG. 1 is a plan view schematically illustrating a related art array substrate of an LCD device, and FIG. 2 is a cross-sectional view taken along line I-I' of FIG. 1. Referring to FIGS. 1 and 2, an array substrate includes a gate line 121 formed in a horizontal direction and a gate electrode 122 extending from the gate line 121. A first diffusion barrier layer 123 is formed under the gate line 121 and the gate electrode 122. The first diffusion barrier layer 123 enhances adhesion between a gate metal layer and an insulating substrate 110 during a gate metal deposition process. A gate insulating layer 130 is formed on the gate line 121 and the gate electrode 122. An active layer 141 and ohmic contact layers 151 and 152 are sequentially formed on the gate insulating layer 130. A data line 161, a source electrode 162, a drain electrode 163, and a capacitor electrode 165 are formed on the ohmic contact layers 151 and 152. Specifically, the data line 161 is formed perpendicular to the gate line 121, and the source electrode 162 is formed extending from the data line 161. The drain electrode 163 is formed opposite to the source electrode 162 with respect to the gate electrode 122. The capacitor electrode 165 is formed to overlap the gate line 121.

A second diffusion barrier layer 164 is formed under the data line 161, the capacity electrode 165, and the source and drain electrodes 162 and 163. The second diffusion barrier layer 164 prevents metal ions of the data line 161 from being diffused into adjacent layers. The data line 161, the source and drain electrodes 162 and 163, and the capacity electrode 165 are covered with a passivation layer 170. The passivation layer 170 has a first contact hole 171 exposing the drain electrode 163 and a second contact hole 172 exposing the capacity electrode 165. A pixel electrode 181 is formed on the passivation layer 170 disposed in a pixel region defined by the crossing of the gate line 121 and the data line 161. The pixel electrode 181 is connected to the drain electrode 163 and the capacitor electrode 165 through the first and second contact holes 171 and 172, respectively. In this way, the array substrate of the LCD device is fabricated by performing a photolithography process using a plurality of masks and a sputtering deposition process several times.

However, the photolithography process includes a plurality of processes such as a cleaning process, a coating process, an exposing process, a developing process, and an etching process. Also, a sputtering deposition process must be performed in a separate sputtering chamber. If one photolithography process and/or one sputtering process can be omitted, fabrication time and fabrication cost will be reduced, and a failure rate of the LCD device also will be decreased. For this reason, it is important to reduce the number of masks and sputtering deposition processes for fabricating the array substrate of the LCD.

SUMMARY OF THE INVENTION

Accordingly, the present invention is directed to an LCD device and a method for fabricating the same that substantially obviate one or more problems due to limitations and disadvantages of the related art.

An object of the present invention is to provide an LCD device having an array with a top gate type TFT, which can simplify a fabrication process by reducing the number of masks and sputtering processes.

Another object of the present invention is to provide a method for fabricating an LCD device having an array with a top gate type TFT, which can simplify a fabrication process by reducing the number of masks and sputtering processes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the LCD device includes a data line formed over a transparent insulating substrate, a source electrode connected to the data line, a drain electrode spaced apart from the source electrode, a first transparent metal layer pattern formed on the transparent insulating substrate under the data line, the data line, the source electrode, and the drain electrode, a pixel electrode extending from the first transparent metal layer pattern formed under the drain electrode, a semiconductor pattern covering the source electrode and the drain electrode, a gate insulating layer formed over the transparent insulating substrate, a gate line crossing the data line, and a gate electrode formed corresponding to the semiconductor pattern and connected to the gate line.

In another aspect of the present invention, the method for fabricating the LCD device, includes sequentially forming a first transparent metal layer and a data metal layer on a transparent insulating substrate, forming a preliminary photoresist pattern having a height difference on the first transparent metal layer and the data metal layer, etching the first transparent metal layer and the data metal layer using the preliminary photoresist pattern as a mask to form a data line, a source electrode connected to the data line, and a drain electrode spaced apart from the source electrode, ashing the preliminary photoresist pattern to form a photoresist pattern exposing a portion of the data metal layer, etching the data metal layer using the photoresist pattern as a mask to form a pixel electrode, the pixel electrode being formed of the first transparent metal layer, forming a semiconductor pattern covering the source electrode and the drain electrode, forming a gate insulating layer over the transparent insulating substrate, and forming a gate line crossing the data line, and a gate electrode connected to the gate line and disposed opposite to the semiconductor pattern.

The LCD device having the array substrate can be fabricated with a reduced number of masking or sputtering processes, thereby reducing the fabrication time of the LCD device and increasing the yield of the LCD device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
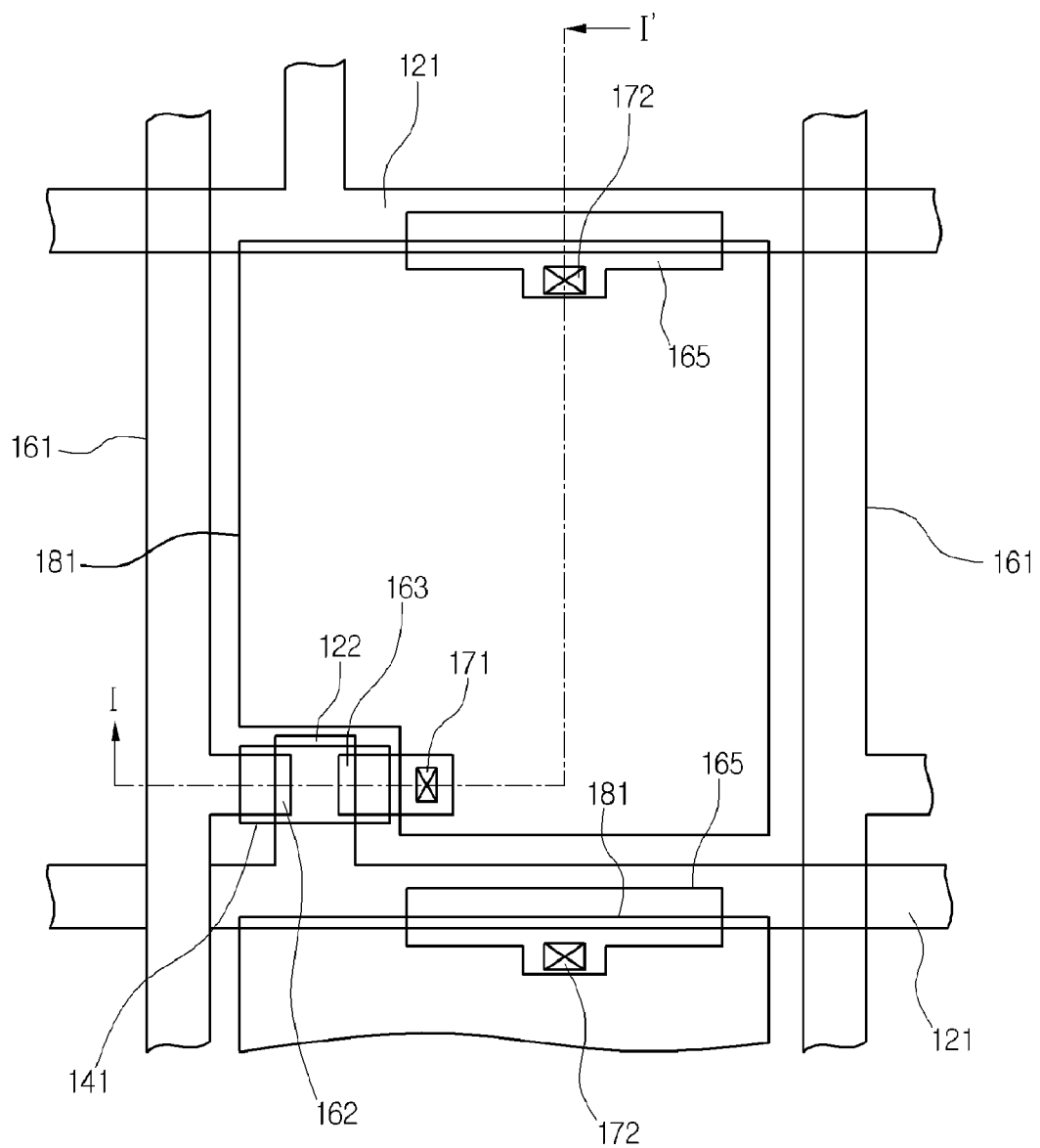
FIG. 1 is a plan view schematically illustrating an array substrate of a liquid crystal display (LCD) device according to the related art.
Figure 2:
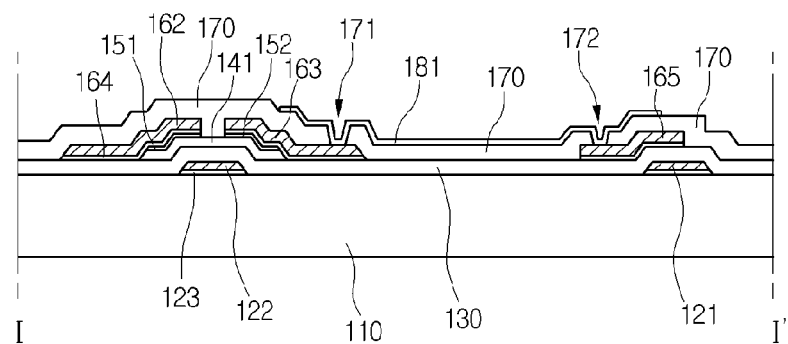
FIG. 2 is a cross-sectional view taken along line I-I' of FIG. 1.
Figure 3:
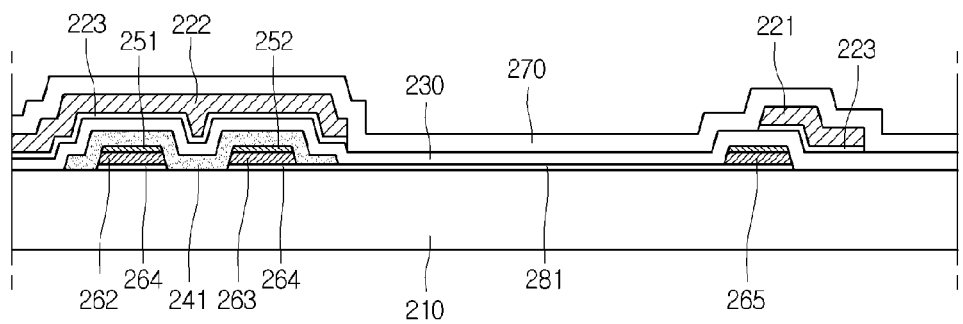
FIG. 3 is a cross-sectional view schematically illustrating one pixel of an array substrate of an LCD device according to a first exemplary embodiment of the present invention.

FIG. 3 is a cross-sectional view schematically illustrating one pixel of an array substrate of an LCD device according to a first exemplary embodiment of the present invention. Referring to FIG. 3, the array substrate of the LCD device includes a transparent insulating substrate 210, a gate electrode 222, a source electrode 262, a drain electrode 263, and a data line. Although not shown in FIG. 3, the data line is formed on the transparent insulating substrate 210 in one direction, and the source electrode 262 is formed extending from the data line. The drain electrode 263 is formed opposite to the source electrode 262 with respect to the gate electrode 222.

A first transparent metal layer 264 is formed under the data line, the source electrode 262, and the drain electrode 263. The first transparent metal layer 264 enhances adhesion between a data metal layer and the insulating substrate 210 during a process of depositing a metal for the data line. The metal for the data line may be referred to as a data metal. The first transparent metal layer 264 formed under the drain electrode 263 extends into a pixel region, thereby forming a pixel electrode 281. The first transparent metal layer 264 and the data metal layer may be sequentially deposited and then patterned using a half-tone mask, a transflective mask, or a diffraction mask.

A capacitor electrode 265 may be further formed using the data metal layer in a portion of the pixel region, such that it overlaps the pixel electrode 281. The first transparent metal layer 264 is deposited to enhance the adhesion between the data metal layer and the insulating substrate 210 before the data metal deposition. Since the pixel electrode 281 is formed by extending the first transparent metal layer 264, the number of masking or sputtering processes is thus reduced.

After the first transparent metal layer 264 and the data metal layer are sequentially deposited, a semiconductor pattern is deposited by implanting impurities into the data metal line, thereby forming ohmic contact layers 251 and 252 on the source electrode 262 and the drain electrode 263. An active layer 241 is formed to create a channel between the source and drain electrodes 262 and 263 disposed under the ohmic contact layers 251 and 252. A gate insulating layer 230 is formed over the insulating substrate 210 where the active layer 241 is formed.

A gate line 221 crossing the data line and the gate electrode 222 extending from the gate line 221 are formed. A second transparent metal layer 223 is formed under the gate line 221 and the gate electrode 222. The second transparent metal layer 223 enhances adhesion between a gate metal layer and the gate insulating layer 230, thereby preventing the diffusion of a gate metal into adjacent layers during a gate metal deposition. Finally, a passivation layer 270 is formed over the insulating substrate 210. The gate line 221 may extend over the capacitor electrode 265. Thus, the capacitor electrode 265, the gate insulating layer 230, and the gate line 221 may constitute a storage capacitor.

Figure 4:
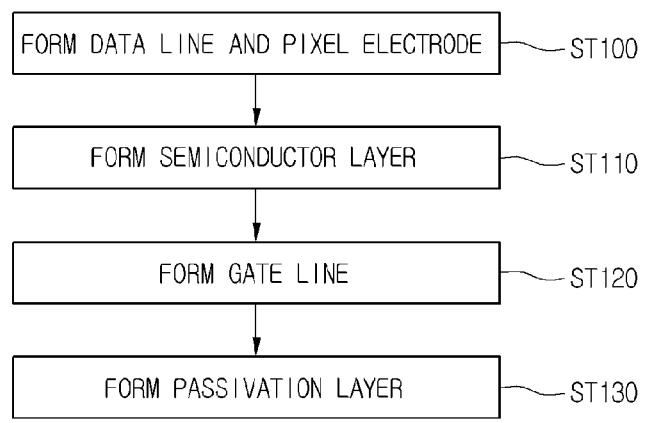
FIG. 4 is a flowchart schematically illustrating a method for fabricating the array substrate of the LCD device according to the first exemplary embodiment of the present invention.
Figure 5A:
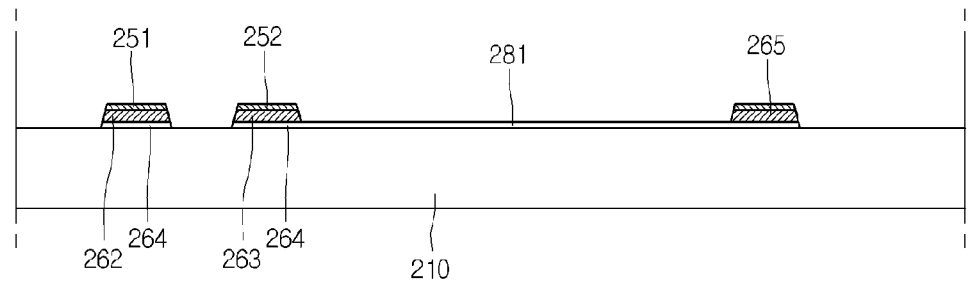
FIGS. 5A to 5E are cross-sectional views schematically illustrating the method for fabricating the array substrate of the LCD device according to the first embodiment of the present invention.

FIG. 4 is a flowchart schematically illustrating a method for fabricating the array substrate of the LCD device according to the first exemplary embodiment of the present invention. FIGS. 5A to 5E are cross-sectional views schematically illustrating the method for fabricating the array substrate of the LCD device according to the first exemplary embodiment of the present invention. Referring to FIGS. 4 and 5A, in operation ST100 of forming data line and pixel electrode, a first transparent metal layer 264 and a data metal layer are sequentially deposited on an insulating substrate 210 and then patterned to form a data line (not shown), a source electrode 262 formed by extending from the data line, a drain electrode 263 formed opposite to the source electrode 262, and a pixel electrode 281. The first transparent metal layer 264 is formed under the data line and the source and drain electrodes 262 and 263.

The first transparent metal layer 264 may be formed of Indium Tin Oxide (ITO), Indium Zinc Oxide (IZO), Indium Tin Zinc Oxide (ITZO), or the like. The data line may be formed of copper (Cu), aluminum (Al) alloy, molybdenum (Mo), tantalum (Ta), titanium (Ti), or the like. The first transparent metal layer 264 prevents metal particles of the gate metal layer from being diffused into adjacent layers. The first transparent metal layer 264 formed under the drain electrode 263 extends into a pixel region, thereby forming the pixel electrode 281.

The first transparent metal layer 264 and the data metal layer may be sequentially deposited and then patterned using a half-tone mask, a transflective mask, or a diffraction mask to form the data line, the source and drain electrodes 262 and 263, and the pixel electrode 281. Specifically, a photoresist layer is formed on the first transparent metal layer 264 and the data metal layer. The photoresist layer is exposed with a different amount of exposure according to its positions and is then developed. As a result, a photoresist pattern having a height difference is formed. Then, the data metal layer and the transparent metal 264 are etched using the photoresist pattern as a mask. A portion of the photoresist pattern is ashed to expose a portion of the data metal layer. The data metal layer is etched using the ashed photoresist pattern as a mask. The first transparent metal layer 264 is deposited to enhance the adhesion between the data metal layer and the insulating substrate 210, thereby preventing the diffusion of the data metal into adjacent layers before the data metal deposition. Since the pixel electrode 281 is formed during the process of depositing the first transparent metal layer 264, the number of masking or sputtering processes is reduced.

Figure 5B:
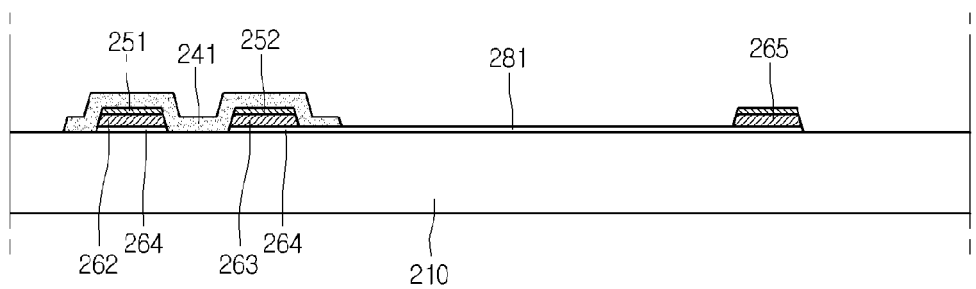

Referring to FIGS. 4 and 5B, in operation ST110 of forming a semiconductor layer, a semiconductor pattern is formed such that a channel is formed between the source electrode 262 and the drain electrode 263. The semiconductor pattern includes an active layer 241 and ohmic contact layers 251 and 252. The ohmic contact layers 251 and 252 may be formed during the formation of the source and drain electrodes 262 and 263. In this case, after the deposition of the first transparent metal layer 264 and the data metal layer, the ohmic contact layers 251 and 252 are sequentially deposited in operation ST100 by implanting impurity ions into the data metal layer. As a result, the ohmic contact layers 251 and 252 remain on the data line and the source and drain electrodes 262 and 263. Thereafter, in operation ST110, the active layer 241 is formed on the source and drain electrodes 262 and 263 on which the ohmic contact layers 251 and 252 are formed. Thus, the semiconductor pattern is formed. Meanwhile, the semiconductor pattern may also be formed during the process of forming the active layer 241 after the formation of the source and drain electrodes 262 and 263.

Figure 5C:
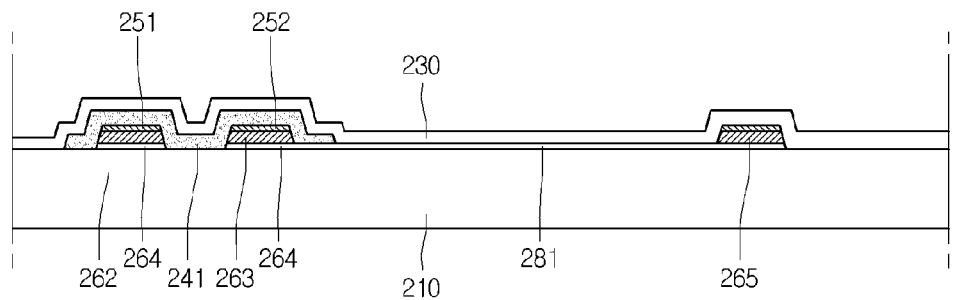
Figure 5D:
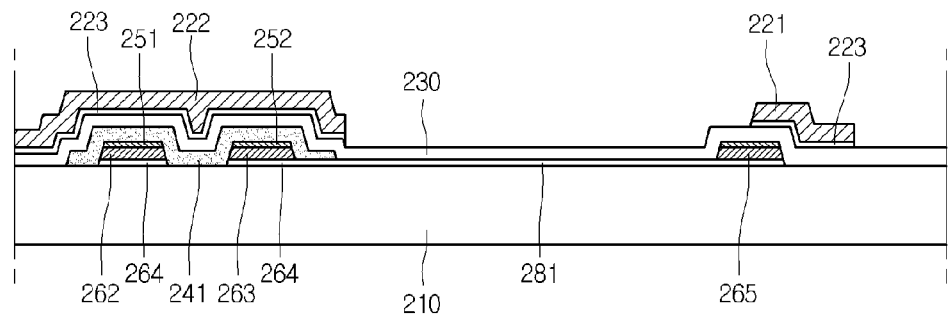
Figure 5E:
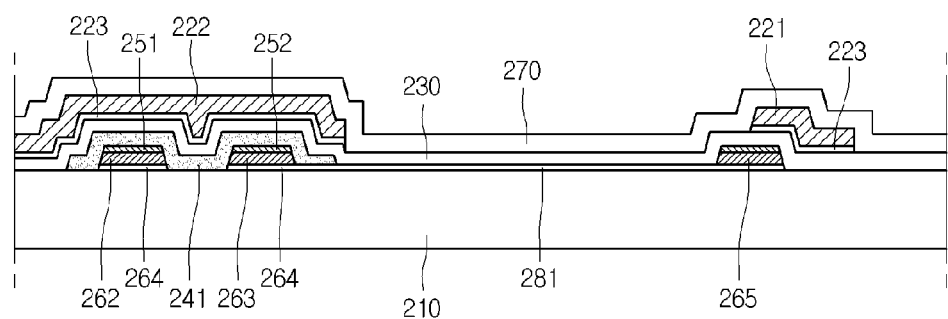

Referring to FIG. 5C, a gate insulating layer 230 is deposited over the insulating substrate 210. Referring to FIGS. 4 and 5D, in operation ST120 of forming a gate line 221, a second transparent metal layer 223 and a gate metal layer are sequentially deposited on the gate insulating layer 230. The second transparent metal layer 223 may be formed of ITO, IZO, ITZO, or the like. The gate metal layer may be formed of Cu, Al, Al alloy, Mo, Ta, Ti, or the like. The second transparent metal layer 223 enhances adhesion between the gate metal layer and the insulating substrate 210, thereby preventing diffusion of the gate metal into the adjacent layers during the gate metal deposition. The second transparent metal layer 223 and the gate metal layer are patterned to form the gate line 221 and the gate electrode 222. The gate line 221 and the gate electrode 222 may be formed by sequentially depositing the second transparent metal layer 223 and the gate metal layer and patterning them using a half-tone mask, a transflective mask, and a diffraction mask. The second transparent metal layer 223 is deposited to enhance the adhesion between the gate metal layer and the insulating substrate 210 before the deposition of the gate metal layer. Referring to FIGS. 4 and 5E, in operation ST130 of forming a passivation layer 270, the passivation layer 270 is further deposited over the resulting structure.

Figure 6:
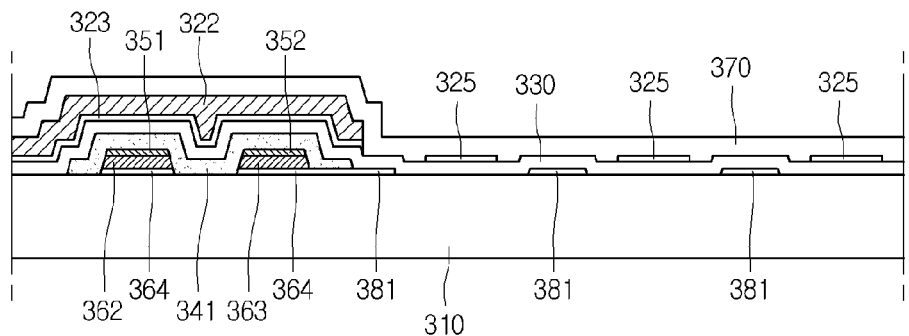
FIG. 6 is a cross-sectional view schematically illustrating one pixel of an array substrate of an in-plane switching (IPS) LCD device according to a second exemplary embodiment of the present invention.

FIG. 6 is a cross-sectional view schematically illustrating one pixel of an array substrate of an IPS LCD device according to a second exemplary embodiment of the present invention. Referring to FIG. 6, the array substrate of a top gate type IPS LCD device includes a transparent insulating substrate 310, a gate electrode 322, a data line, a source electrode 362, and a drain electrode 363. Although not shown, the data line is formed on the transparent insulating substrate 310 in one direction, and the source electrode 362 is formed extending from the data line. The drain electrode 363 is formed opposite to the source electrode 362 with respect to the gate electrode 322.

A first transparent metal layer 364 is formed under the data line, the source electrode 362, and the drain electrode 363. The first transparent metal layer 364 enhances adhesion between a data metal layer and the insulating substrate 310 during the deposition of the data metal layer. The first transparent metal layer 364 formed under the drain electrode 363 extends into a pixel region, thereby forming a plurality of pixel electrodes 381 spaced apart from one another by a predetermined distance. The first transparent metal layer 364 and the data metal layer may be sequentially deposited and then patterned using a half-tone mask, a transflective mask, or a diffraction mask. A capacitor electrode 365 may be further formed using a data metal layer in a portion of the pixel region, such that it overlaps the pixel electrode 381. The first transparent metal layer 364 is deposited so as to enhance the adhesion between the data metal layer and the insulating substrate 310 before the data metal deposition. Since the first transparent metal layer 364 is also used to form the plurality of pixel electrodes 381, the number of masking or sputtering processes is thus reduced.

After the first transparent metal layer 364 and the data metal layer are sequentially deposited, a semiconductor pattern is deposited by implanting impurities into the data metal layer, thereby forming ohmic contact layers 351 and 352 on the source electrode 362 and the drain electrode 363. An active layer 341 is formed to create a channel between the source and drain electrodes 262 and 263 disposed under the ohmic contact layers 351 and 352. A gate insulating layer 330 is formed over the insulating substrate 310 where the active layer 241 is formed. A gate line 321 crossing the data line and the gate electrode 322 extending from the gate line 321 are formed.

A second transparent metal layer 323 is formed under the gate line 321 and the gate electrode 322. The second transparent metal layer 323 enhances adhesion between the gate metal layer and the gate insulating layer 230, thereby preventing the diffusion of a gate metal into adjacent layers during a gate metal deposition. The second transparent metal layer 323 is branched into a plurality of common electrodes 325 under a common line in the pixels. Although not shown, the common line is formed in a direction parallel to the gate line 321. The plurality of common electrodes 325 are electrically connected to the common line and form horizontal electric field with the pixel electrodes 381.

The gate line 321, the common line, and the common electrodes 325 may be formed by sequentially depositing the second transparent metal layer 323 and the gate metal layer and patterning them using a half tone mask, a transflective mask, or a diffraction mask. Since the common electrodes 325 contact the common line, a common signal can be transferred to the common electrodes 325 without additional contact holes. The second transparent metal layer 323 is deposited to enhance the adhesion between the gate metal layer and the insulating substrate 310 before the gate metal deposition. Since the common electrodes 325 are formed in the process of depositing the second transparent metal layer 323, the number of masking or sputtering processes is reduced.

Finally, a passivation layer 370 is further formed over the insulating substrate 310. Meanwhile, the gate line 321 may extend over the capacitor electrode 365. Therefore, the capacitor electrode 365, the gate insulating layer 330, and the gate line 321 may constitute a storage capacitor. In the second embodiment, the first and second transparent metal layers 364 and 323 may be formed of ITO, IZO, ITZO, or the like. The gate line 321 and the data line may be formed of Cu, Al alloy, Mo, Ta, Ti, or the like.

Figure 7:
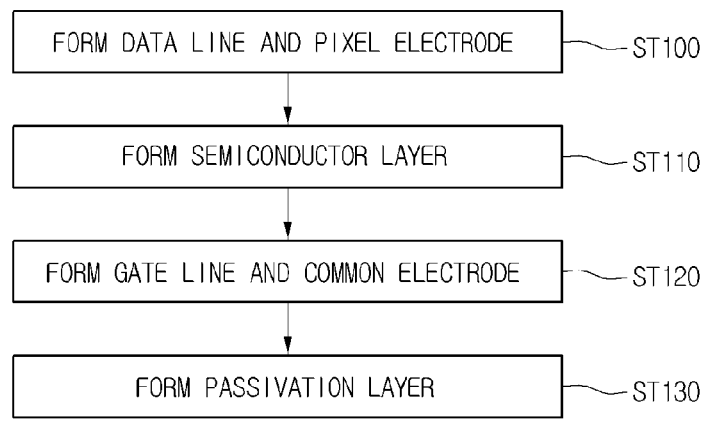
FIG. 7 is a flowchart schematically illustrating a method for fabricating the array substrate of the IPS LCD device according to the second exemplary embodiment of the present invention.

FIG. 7 is a flowchart schematically illustrating a method for fabricating the array substrate of the LCD device according to the second exemplary embodiment of the present invention. FIGS. 8A to 8D are cross-sectional views schematically illustrating the method for fabricating the array substrate of the LCD device according to the second exemplary embodiment of the present invention.

Figure 8A:
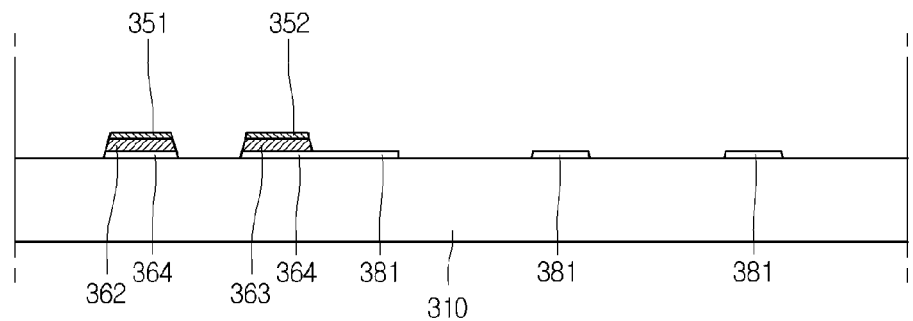
FIGS. 8A to 8D are cross-sectional views schematically illustrating the method for fabricating the array substrate of the IPS LCD device according to the second exemplary embodiment of the present invention.

Referring to FIGS. 7 and 8A, in operation ST100 of forming data line and pixel electrode, a first transparent metal layer 364 and a data metal layer are sequentially deposited on a transparent insulating substrate 310 and then patterned to form a data line (not shown), a source electrode 362, a drain electrode 363, and pixel electrodes 381. The first transparent metal layer 364 is formed under the data line and the source and drain electrodes 362 and 363. The first transparent metal layer 364 may be formed of ITO, IZO, ITZO, or the like. The data line may be formed of Cu, Al, Al alloy, Mo, Ta, Ti, or the like. The first transparent metal layer 364 prevents metal particles of the data metal layer from being diffused into adjacent layers. The pixel electrodes 381 are formed by extending the first transparent metal layer 364 formed under the drain electrode 363 into a pixel region.

The first transparent metal layer 364 and the data metal layer are sequentially deposited and then patterned using a half-tone mask, a transflective mask, or a diffraction mask to form the data line, the source and drain electrodes 362 and 363, and the pixel electrodes 381. The first transparent metal layer 364 is deposited to enhance the adhesion between the data metal layer and the insulating substrate 310, thereby preventing the diffusion of the data metal into the adjacent layers before the deposition of the data metal layer. Since the first transparent metal layer 364 is used as the pixel electrodes 381, the number of masking or sputtering processes is reduced.

Figure 8B:
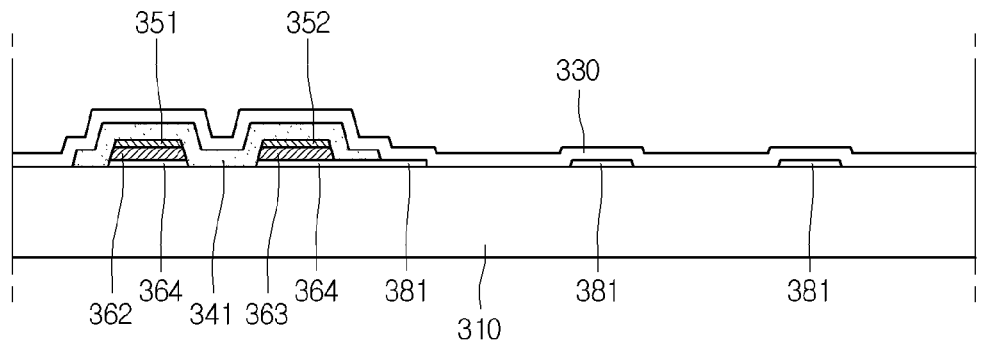

Referring to FIGS. 7 and 8B, in operation ST110 of forming a semiconductor layer, a semiconductor pattern is formed such that a channel is formed between the source electrode 362 and the drain electrode 363. The semiconductor pattern includes an active layer 341 and ohmic contact layers 351 and 352. The ohmic contact layers 351 and 352 may be formed by sequentially depositing the semiconductor patterns, which are formed by implanting impurities during the formation of the source and drain electrodes 362 and 363, and meanwhile etching the deposited semiconductor patterns. Alternatively, after the formation of the source and drain electrodes 362 and 363, the ohmic contact layers 351 and 352 may be formed during the process of forming the active layer 341.

Figure 8C:
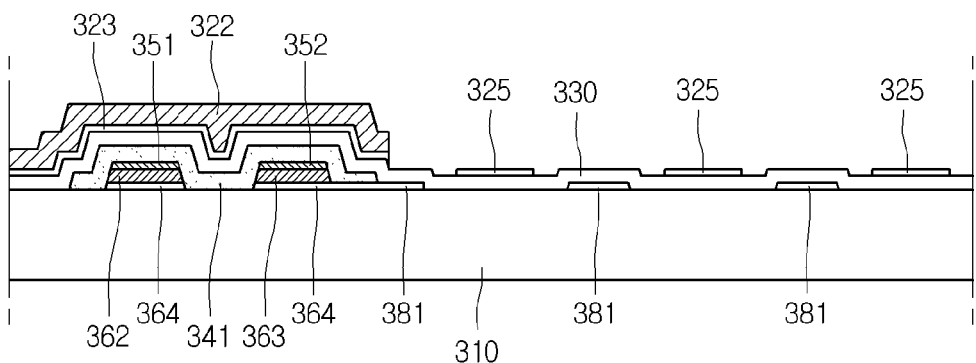

Referring to FIGS. 7 and 8C, in operation ST120 of forming gate line and common electrode, a gate insulating layer 330 is formed over the insulating substrate 310. Then, a second transparent metal layer 323 and a gate metal layer are sequentially deposited on the gate insulating layer 330. The second transparent metal layer 323 enhances adhesion between the gate metal layer and the insulating substrate 310, thereby preventing diffusion of the gate metal into the adjacent layers during the gate metal deposition. The second transparent metal layer 323 and the gate metal layer are patterned to form the gate line 321, the gate electrode 322, and the common electrodes 325. The second transparent metal layer 323 is branched into the plurality of common electrodes 325 under a common line in the pixels. Although not shown, the common line is formed in a direction parallel to the gate line 321. The plurality of common electrodes 325 are electrically connected to the common line and generate horizontal electric field with the pixel electrodes 381.

The gate line 321, the common line, and the common electrodes 325 may be formed by sequentially depositing the second transparent metal layer 323 and the gate metal layer and patterning them using a half tone mask, a transflective mask, or a diffraction mask. The second transparent metal layer 323 is deposited to enhance the adhesion between the gate metal layer and the insulating substrate 310 before the gate metal deposition. Since the second transparent metal layer 323 is also used to form the plurality of common electrodes 325, the number of masking or sputtering processes is reduced.

Figure 8D:
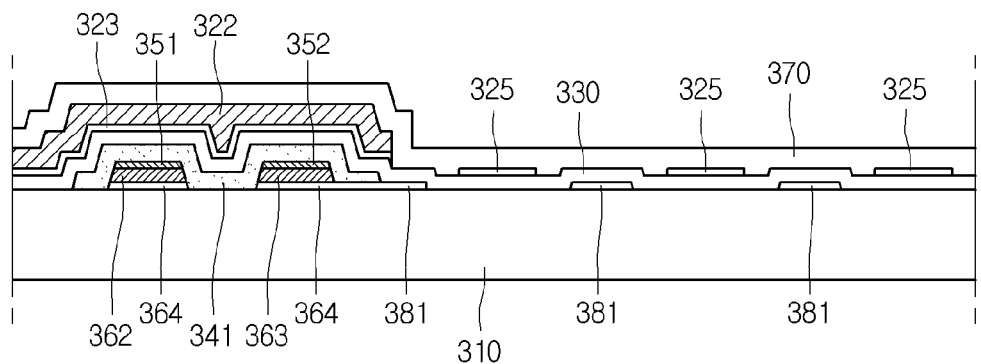

Referring to FIGS. 7 and 8D, in operation ST130 of forming a passivation layer, a passivation layer 370 is further deposited over the resulting structure. As described above, the array substrate of the LCD device can be fabricated with a reduced number of masking or sputtering processes, thereby reducing the fabrication time of the LCD device and increasing the yield of the LCD device.

It will be apparent to those skilled in the art that various modifications and variations can be made in the LCD device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display device, comprising:
   forming a first transparent metal layer on a substrate;
   forming a data metal layer on the first transparent metal layer;
   forming a preliminary photoresist pattern having a height difference on the data metal layer;
   etching the first transparent metal layer and the data metal layer using the preliminary photoresist pattern as a mask to form a data line, a source electrode connected to the data line, and a drain electrode spaced apart from the source electrode;
   ashing the preliminary photoresist pattern to form a photoresist pattern exposing a portion of the data metal layer;
   etching the data metal layer using the photoresist pattern as a mask to form a pixel electrode connected to the first transparent metal layer;
   forming a semiconductor pattern covering the source electrode and the drain electrode;
   forming a gate insulating layer over the substrate; and
   forming a gate line crossing the data line, and a gate electrode connected to the gate line and disposed opposite to the semiconductor pattern.

2. The method according to claim 1, further comprising, after the forming of the first transparent metal layer and the data metal layer, forming an ohmic contact layer including a semiconductor layer implanted impurities on the data metal layer.

3. The method according to claim 1, wherein the forming of the gate line and the gate electrode includes:
   forming a second transparent metal layer on the gate insulating layer;
   forming a gate metal layer on the second transparent metal layer; and
   patterning the second transparent metal layer and the gate metal layer to form the gate line and the gate electrode.

4. The method according to claim 3, wherein the forming of the gate line and the gate electrode further includes forming a common line in a direction parallel to the gate line.

5. The method according to claim 3, wherein the second transparent metal layer and the gate metal layer are patterned using one of a half-tone mask, a transflective mask, and a diffraction mask to form a common electrode connected to the common line, the common electrode being formed of the second transparent metal layer.

* * * * *